United States Patent
Bian

(10) Patent No.: US 9,401,422 B2
(45) Date of Patent: Jul. 26, 2016

(54) TRENCH DMOS DEVICE WITH REDUCED GATE RESISTANCE AND MANUFACTURING METHOD THEREOF

(71) Applicant: CSMC TECHNOLOGIES FAB1 CO., LTD., Jiangsu (CN)

(72) Inventor: Zheng Bian, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/651,706

(22) PCT Filed: Dec. 31, 2013

(86) PCT No.: PCT/CN2013/091154
§ 371 (c)(1),
(2) Date: Jun. 12, 2015

(87) PCT Pub. No.: WO2014/110977
PCT Pub. Date: Jul. 24, 2014

(65) Prior Publication Data
US 2015/0333176 A1 Nov. 19, 2015

(30) Foreign Application Priority Data
Jan. 15, 2013 (CN) .......................... 2013 1 0014452

(51) Int. Cl.
*H01L 29/78* (2006.01)
*H01L 21/265* (2006.01)
(Continued)

(52) U.S. Cl.
CPC .......... *H01L 29/7813* (2013.01); *H01L 21/265* (2013.01); *H01L 29/401* (2013.01); *H01L 29/41766* (2013.01); *H01L 29/4916* (2013.01); *H01L 29/66681* (2013.01); *H01L 29/66734* (2013.01); *H01L 29/7811* (2013.01); *H01L 29/0619* (2013.01); *H01L 29/1095* (2013.01); *H01L 29/42372* (2013.01); *H01L 29/66727* (2013.01)

(58) Field of Classification Search
None
See application file for complete search history.

(56) References Cited

U.S. PATENT DOCUMENTS 6,657,256 B2 * 12/2003 Hshieh ................ H01L 29/7808
257/330
7,767,530 B2 * 8/2010 Cho ..................... H01L 29/7813
257/330

(Continued)

FOREIGN PATENT DOCUMENTS

| CN | 1917233 A | 2/2007 |
|---|---|---|
| CN | 101465375 A | 6/2009 |
| CN | 102263107 A | 11/2011 |

OTHER PUBLICATIONS

International Search Report dated Feb. 20, 2014, for PCT/CN2013/091154.

*Primary Examiner* — Scott B Geyer
(74) *Attorney, Agent, or Firm* — Polsinelli PC

(57) ABSTRACT

A trench-type DMOS device includes a substrate as a public drain region, an active region and a voltage-dividing ring formed on the substrate, and a first dielectric layer formed on the substrate. Multiple trenches are located on the first dielectric layer, and the trenches extend from the surface of the first dielectric layer into the interior of the substrate. The trenches comprise at least one first trench distributed in the active region and a second trench outside the active region. A gate oxide layer is formed in the trench and polycrystalline silicon is filled to form a gate. The active region further comprises a source electrode region and a P-type heavily doped region under the source electrode region. A second dielectric layer covers the first dielectric layer and the multiple trenches. A metal layer covers the second dielectric layer to form a first electrode region and a second electrode region.

16 Claims, 5 Drawing Sheets

(51) Int. Cl.
   *H01L 29/40*  (2006.01)
   *H01L 29/49*  (2006.01)
   *H01L 29/66*  (2006.01)
   *H01L 29/417* (2006.01)
   *H01L 29/423*  (2006.01)
   *H01L 29/06*   (2006.01)
   *H01L 29/10*   (2006.01)

(56) References Cited

U.S. PATENT DOCUMENTS

| | | | | |
|---|---|---|---|---|
| 7,772,642 B2 * | 8/2010 | Marchant | ............. | H01L 29/407 257/330 |
| 7,816,732 B2 * | 10/2010 | Hsieh | ................. | H01L 27/0629 257/334 |
| 7,956,410 B2 * | 6/2011 | Hsieh | ................. | H01L 27/0255 257/328 |
| 8,022,475 B2 * | 9/2011 | Takeda | ............ | H01L 21/823412 257/331 |
| 8,159,025 B2 * | 4/2012 | Tang | ................... | H01L 29/0878 257/330 |
| 8,362,547 B2 | 1/2013 | Bhalla et al. | | |
| 2006/0273382 A1 | 12/2006 | Hshieh | | |
| 2009/0065814 A1 | 3/2009 | Bhalla et al. | | |
| 2009/0315103 A1 | 12/2009 | Hsieh | | |
| 2010/0224931 A1 * | 9/2010 | Hsieh | ................. | H01L 27/0255 257/328 |
| 2011/0291186 A1 * | 12/2011 | Yilmaz | ............... | H01L 29/4236 257/334 |
| 2012/0153384 A1 * | 6/2012 | Grebs | ................. | H01L 29/0653 257/331 |

* cited by examiner

TRENCH DMOS DEVICE WITH REDUCED GATE RESISTANCE AND MANUFACTURING METHOD THEREOF

CROSS-REFERENCE TO RELATED APPLICATIONS

This application is a National Phase filing under 35 U.S.C. §371 of PCT/CN2013/091154 filed on Dec. 31, 2013, which claims priority to Chinese Patent Application Serial No. 201310014452.0 tiled on Jan. 15, 2013 the entire contents of which are hereby incorporated by reference in their entireties.

FIELD OF THE INVENTION

The present invention relates to a DMOS transistor, and more particularly, relates to a trench-type DMOS device and a manufacturing method thereof.

REARGROUND OF THE INVENTION

DMOS (Double-diffused MOS) transistor is a type of MOSFET (Metal-Oxide-Semiconductor Field Effect Transistor), and employs two diffusion steps in sequence which are aligned on the same edge to form a groove channel region of the transistor. Generally, DMOS transistor is a device which works under a high voltage and a high current, serving as an independent transistor/unit in a power integrated circuit. DMOS transistor can provide a high current for each cell area which has a low forward voltage drop.

The typical independent DMOS transistor structure includes two or more than two single DMOS transistor units which are parallel manufactured. The single DMOS transistors share a common drain contact (substrate). The source electrodes thereof are short-cut by metal, and the gate electrodes thereof are short-cut by poly-silicon. Therefore, even if the independent DMOS circuit are constructed by small transistors array, when running, it serves as a single large transistor. For the single independent DMOS, when the transistor matrix are switched on via the gate electrode, it is desired to allow the electrical conductivity on each cell area attaining a maximum value.

A specific DMOS transistor is the so-called trench-type DMOS transistor, wherein the groove channel is presented on an inner wall of the trench extending from the source electrode to the drain electrode, and the gate electrode is formed within the trench. Compared with the vertical DMOS transistor structure, minor limited current flowing through the trench which is aligned to the thinner oxide layer to form a straight line and is filled with poly-silicon are permitted, thus providing a relative low specific turn-on resistance value.

For DMOS device, the gate electrode resistance determines the output capability of the device. Generally, in order to obtain a large amount of the output current, it is required to reduce the gate electrode resistance value Rg as more as possible. Among the existing methods, an approach is to increase the number of the trenches, so as to reduce the Rg. However, in such approach, the optimization of the Rg is limited, and accompanying to the increasing of the trenches, not only the size of the device is increased, but also the manufacturing method thereof is more complicated.

Therefore, how to reduce the gate electrode resistance value Rg has already become an issue drawing intensive concerns in the industry.

SUMMARY OF THE INVENTION

Accordingly, it is necessary to provide a trench-type DMOS device having relative low gate electrode resistance Rg, and a method of manufacturing the DMOS device.

a substrate of a first conductive type, the substrate serving as a common drain region;

an active region of a second conductive type formed on the substrate;

a first dielectric layer formed on the substrate, the first dielectric layer defining a plurality of trenches extending from a surface of the first dielectric layer to an interior of the substrate, the plurality of trenches including a first trench located in the active region and a second trench located outside the active region, the first trench fluid communicating with the second trench;

conductive material filled in the plurality of trenches;

an oxide layer positioned between the conductive material and trench walls of the plurality of trenches;

a source electrode region located in the active region and adjacent to the first trench;

a second dielectric layer covering the first dielectric layer and the plurality of trenches; and a metallic layer covering the second dielectric layer, wherein the metallic layer includes a first electrode region and a second electrode region insulated from each other, the first electrode region is electrically connected to the source electrode region via a first conductive pole which extends through the first dielectric layer and the second dielectric layer, thereby forming a source electrode, the second electrode region is electrically connected to the conductive material via a second conductive pole which extends through the second dielectric layer, thereby forming a gate electrode.

According to one embodiment, a depth of the trench is greater than a depth of the active region.

According to one embodiment, the substrate is an N-type substrate, the active region is P-type active region, and the source electrode region is a heavily doped N-type region.

According to one embodiment, the trench-type DMOS device further includes a heavily doped P-type region located at a bottom of the active region beneath of the source electrode region.

According to one embodiment, the conductive material is polycrystalline silicon, the oxide layer is made of silicon oxide.

According to one embodiment, the first conductive pole and the second conductive are made of tungsten.

According to one embodiment, the substrate further includes a plurality of P-type voltage-dividing rings located around the active region.

According to one embodiment, further including an oxide layer located on a top of the conductive material in the trench, wherein the oxide layer insolates the conductive material from the second dielectric layer.

According to one embodiment, the first dielectric layer includes a boron phosphorous silicate glass layer, and a silicon oxide layer prepared from ethyl silicate, which is laminated on the silicon oxide layer the boron phosphorous silicate glass layer.

A method of manufacturing above-described trench-type DMOS device, includes:

providing a substrate of a first conductive type, the substrate serving as a common drain electrode region;

doping the substrate to form an active region of a second conductive type;

forming a first dielectric layer on the substrate, and etching the first dielectric layer to form a plurality of trenches, the plurality of trenches extending from a surface of the first dielectric layer to an interior of the substrate, the plurality of trenches including a first trench located in the active region and a second trench located outside the active region, the first trench being fluid communicated with the second trench;

forming an oxide layer on trench wall of the trench, and filling the plurality of trenches with conductive material;

depositing a second dielectric layer on the first dielectric layer and surfaces of the trenches, and etching the second dielectric layer to form a first conductive via extending through the second dielectric layer and the first dielectric layer, until the first conductive via reaching the substrate, and forming a second conductive via extending through the second dielectric layer, until the second conductive via reaching the second trench, the first conductive via being adjacent to the first trench;

applying a heavily doping of the first conductive type to the active region via the first conductive via, thereby forming a source electrode region, and filling the first conductive via and the conductive via with tungsten, thereby forming a first conductive pole and a second conductive pole; and depositing a metallic layer on the second dielectric layer, and etching the metallic layer to form a first electrode region and a second electrode insulated from each other, electrically connecting the first electrode region to the source electrode region via the first conductive pole, thereby forming a source electrode, electrically connecting the second electrode region to the conductive material in the second trench via the second conductive pole, thereby forming a gate electrode.

According to one embodiment, a depth of the trench is greater than a depth of the active region.

According to one embodiment, the substrate is an N-type substrate, the active region is P-type active region, and the source electrode region is a heavily doped N-type region.

According to one embodiment, prior to the filing the first conductive via with tungsten, the method further includes: applying an ion-implantation to a bottom of the active region via the first conductive via to form a heavily doped P-type region, the heavily doped P-type region being located beneath the source electrode region.

According to one embodiment, the conductive material is polycrystalline silicon, the oxide layer is made of silicon oxide.

According to one embodiment, after the forming an active region, the method further includes: forming a plurality of P-type voltage-dividing rings around the active region of the substrate.

According to one embodiment, after the filling the plurality of trenches with conductive material, the method further includes: forming an oxide layer on a top of the conductive material in the trench, the oxide layer insolating the conductive material from the second dielectric layer.

In the forgoing trench-type DMOS device, the trenches which serve as the main gate electrode region extend from the surface of the first dielectric layer to the substrate. Compared to the conventional trenches manufactured merely in the substrate, the trench of the present invention enables the gate electrode polycrystalline silicon to have a relative larger cross-sectional area, thus effectively reducing the gate electrode resistance Rg. In addition, in the process of manufacturing the device, the injection of the source electrode region is directly conducted by virtue of conductive via, the step of photo-etching for the source injection is omitted, thus simplying the manufacturing process.

BRIEF DESCRIPTION OF THE DRAWINGS

These and other features of the present invention will become readily apparent upon further review of the following specification and drawings. In the drawings, like reference numerals designate corresponding parts throughout the views. Moreover, components in the drawings are not necessarily drawn to scale, the emphasis instead being placed upon clearly illustrating the principles of the present disclosure.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

In view of the problem in the prior art that it is difficult to effectively reduce the gate electrode resistance Rg of the trench-type DOMS device, it is necessary for the embodiment to provide a trench-type DMOS device and a manufacturing method thereof.

Figure 1:
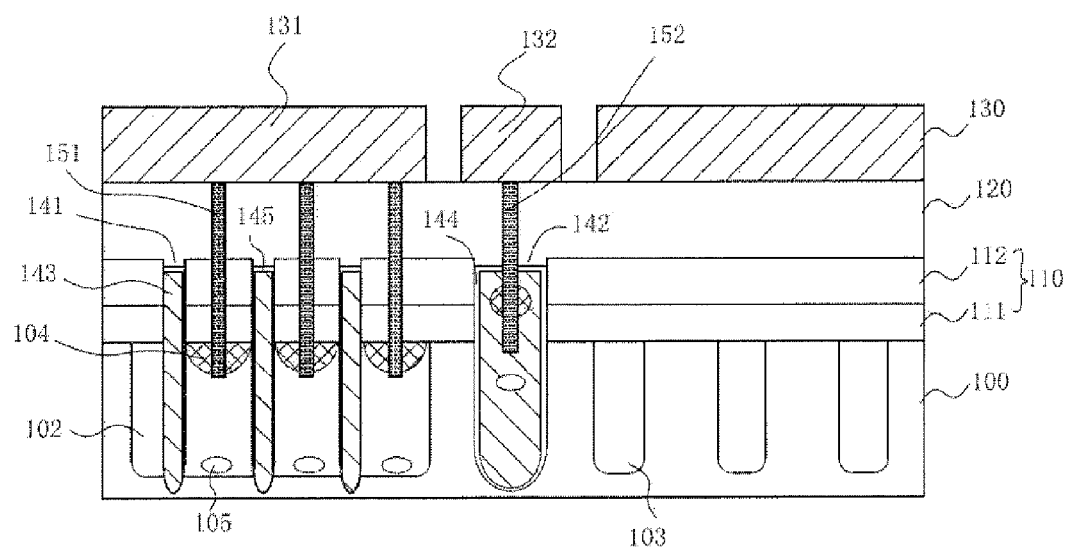
FIG. 1 is a schematically view of a trench-type DMOS device according to an embodiment.

FIG. 1 schematically shows a trench-type DMOS device according to an embodiment. As shown in FIG. 1, the DMOS device includes a substrate 100. The substrate 100 has a first conductive type, which can be N-type, and can also be P-type, depending on the device's function. The embodiment takes the first conductive type as N-type for example. Similar to other trench-type DMOS devices, the substrate 100 serves as a common drain region of the device.

The DMOS device further includes an active region 102 formed within the substrate 100. The active region 102 is a second conductive type region, and is formed by doping impurities of second conductive type into the substrate 100 via ion-implantation technology. The second conductive type is P-type, for example. Further, in order to improve the breakdown voltage of the device, at the time of manufacturing the active region 102, in the procedure of one step ion-implantation process, a plurality of voltage-dividing rings 103 are generally manufactured on the substrate 100. The voltage-dividing rings 103 are distributed around the active region 102, conducting a surface breakdown protection.

The DOMS device further includes a first dielectric layer 110 formed on the substrate 100. The first dielectric layer 110 generally includes a boron phosphorous silicate glass (BPSG) layer 111 which is prepared from chemical vapor deposition, and a silicon dioxide (TEOS) layer 112 which is prepared from chemical vapor deposition based upon ethyl silicate. The BPSG layer 111 is formed on the substrate 100, and generally serves as a buffer layer between the surfaces of the dielectric and the silicon, due to the high toughness of the material and the impurities absorption character. The TEOS layer 112 is laminated upon BPSG layer 111. Due to a high hardness of the material and a better insulation effect, the TEOS layer 112 facilitates to a batch growth and serves as a host material of the dielectric layer.

The first dielectric layer 110 defines a plurality of trenches. Such trenches extends from the surface of the first dielectric layer 110 to an interior of the substrate 110. The trenches includes at least one first trench 141 (three first trenches shown in the figures) and a second trench 142 fluid communicating with the first trench 141. The at least one first trench 141 is distributed in the active region 102, the second trench 141 is located outside the active region 102. The first trench 141 constitutes the main gate electrode of the DMOS device. The second trench 142 leads the gate electrode out, such that the second trench 142 is made much more bigger. In addition, in order to facilitate manufacturing the leading wire of the gate electrode, it is desired to form the second trench 142 outside the active region 102, therefore, avoiding the mutual interference with the source electrode leading wire. Furthermore, it is desired to produce the trench munch more deeper, such as reaching 1.1 micrometer in depth, such depth is greater than that of the active region 102 (about 0.8 micrometer), which is conductive to control the device by the gate electrode voltage.

The trenches are filled with conductive materials 143 to form the gate electrode. The conductive material 143 is polycrystalline silicon in general. In some special application occasions, the conductive material 143 may be metals such as aluminum, copper and so on. Between the conductive material 143 and the trench wall of the trench, an oxide layer 144 is provided. The oxide layer 144 is silicon oxide in general, serving as a gate-oxide. Further, on a top of the conductive material 143 in the trench, an oxide layer 145 is further included, and insolates the conductive material 143 from a second dielectric layer 120 formed in the following steps.

The DMOS device further includes a source electrode region 104 in the active region 102 formed by ion-implantation. Generally, the source electrode region 104 is a heavily doped N-type region, which is formed on an adjacent region of the first trench 141. Further, a P-type heavily doped region 105 can be formed on a bottom of the active region 120 beneath the source electrode region 104. The P-type heavily doped region 105 is formed by ion-implantation technology, and is configured for improving a surging impact resistance of the device in switching transient.

The DMOS device further includes a second dielectric layer 120 covering the first dielectric layer 110 and the plurality of trenches.

The DMOS device further includes a metallic layer 130 covering the second dielectric layer 120. The metallic layer 130 includes a first electrode region 131 and a second electrode region 132 insulated from each other. The first electrode region 131 is electrically connected to the source electrode region 104 via a first conductive pole 151 which extends through the first dielectric layer 110 and the second dielectric layer 120, thereby forming the source electrode. The second electrode region 132 is electrically connected to the conductive material 143 via a second conductive pole 152 which extends through the second dielectric layer 120, thereby forming the gate electrode. The conductive poles are formed by connecting lines between metallic layers, the conductive material thereof is tungsten.

The manufacturing method of above-described trench-type DMOS device is illustrated hereinafter.

Figure 2:
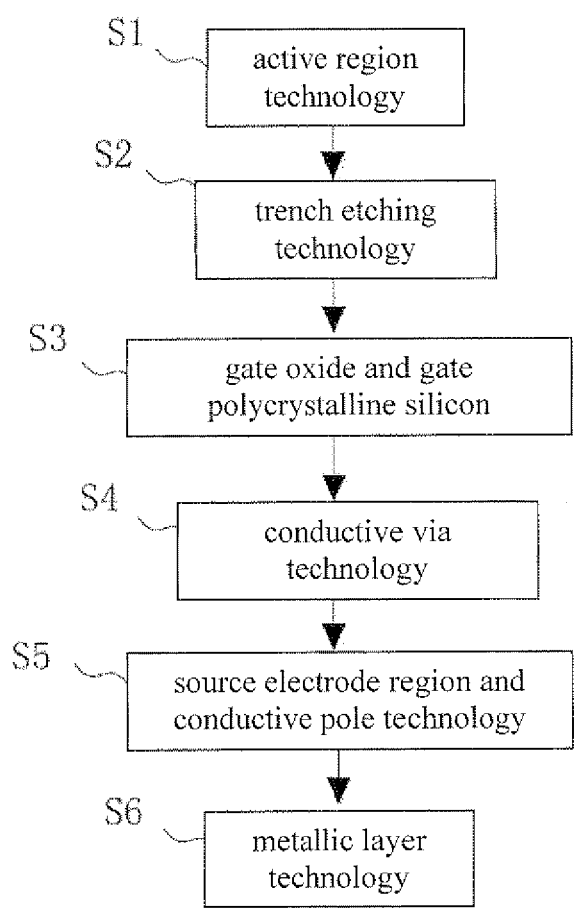
FIG. 2 is a flowchart of a method of manufacturing a trench-type DMOS device, according to an embodiment.

Referring to FIG. 3A through FIG. 3E together with FIG. 2 accordingly. FIG. 2 is a flowchart of a method for manufacturing a trench-type DMOS device of the present invention. FIG. 3A-3E are cross-sectional views of the DMOS device corresponding to above-described method. As shown in the figures, the manufacturing method of the present invention includes steps as follows:

S1: active region technology: the substrate of the first conductive type is doped to form an active region of the second conductive type. The process specifically includes:

S11: an N-type substrate 100 is provided, the substrate 100 may be silicon substrate for example, and serves as a common drain electrode region. The N-type substrate 100 is oxidized to form an oxide layer on the surface, the oxide layer conducts a buffer protection in the following ion-implantation.

S12: windows for ion-implantation are manufactured by photo-etching process. Above-described substrate is coated with a photo-resist layer 101. An active region mask is employed to conduct an exposure and develop step on the photo-resist 101 to pattern the photo-resist, thereby exposing parts of the substrate which is to form the active region. In the step, the active region mask may include voltage-dividing ring patterns distributed around the active region, such that voltage-dividing rings 20 can be manufactured on the substrate 100 simultaneously.

S13: the patterned photo-resist is employed as a mask, and an ion-implantation is applied to the substrate.

S14: the photo-resist is removed.

S15: the ion-implantation region is driven in to allow the doped ions to diffuse, thereby forming the active region 102. The voltage-dividing rings 103 can be formed simultaneously in the step, referring to FIG. 3A.

S2: trench etching technology: the first dielectric layer 110 is manufactured on above-described substrate, and the first dielectric layer 110 is etched to form a plurality of trenches. The plurality of trenches extends from the surface of the first dielectric layer 110 to an interior of the substrate 110. The plurality of trenches is divided into at least one first trench 141 distributed in the active region and a second trench 142 distributed in the non-active region. The process specially includes:

S21: the oxide layer formed in step S11 for buffering ion-implantation is stripped.

S22: a first dielectric layer 110 is deposited on the substrate after stripping. The first dialectic layer 110 can be divided into a BPSG layer 111 and a TEOS layer 112. In other occasions, the first dielectric layer 110 may be one layer or more than two layers.

S23: windows for etching trench are manufactured on the first dielectric layer 110 by photo-etching process. Special details of the photo-etching process can be seen in S12, and are not specially described hereby.

S24: the first dielectric layer 110 is etched via windows formed by step S23, thereby forming trench patterns in the dielectric layer 110.

Figure 3A:
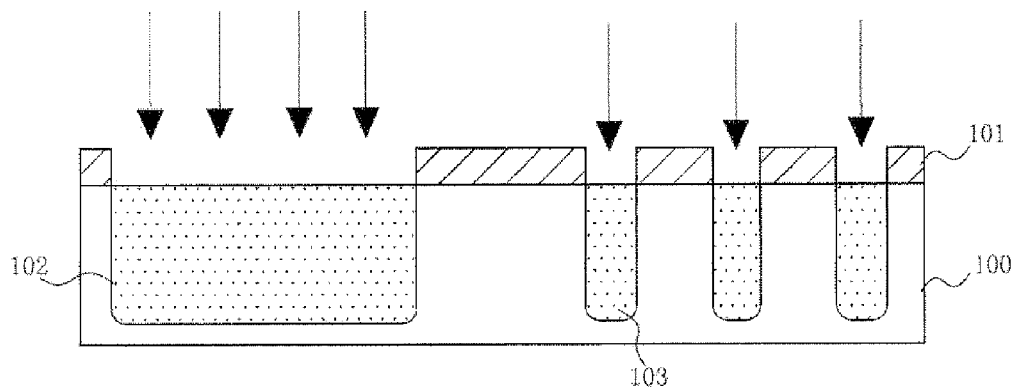
FIGS. 3A through 3E are cross-sectional views of the device corresponding to above-described method.
Figure 3B:
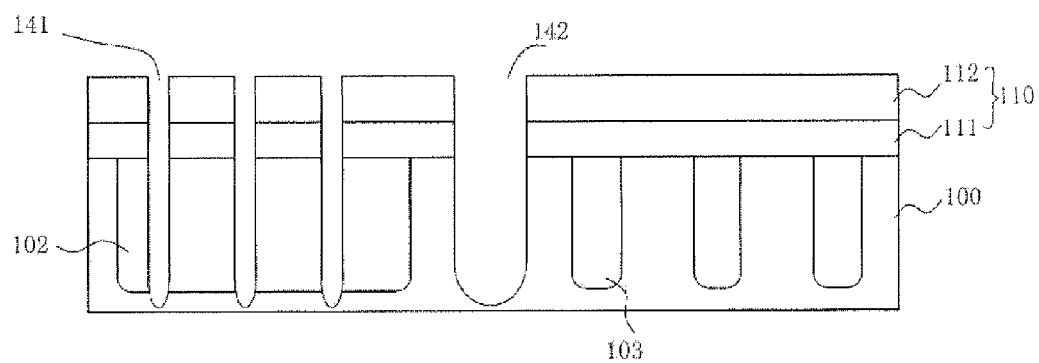

S25: residual photo-resist in the step S24 is removed, the trench pattern on the first dielectric layer 110 is employed as a mask and the silicon substrate is etched to produce trenches thereon, thus accomplishing the etching of the overall trenches, referring to FIG. 3B.

Figure 3C:
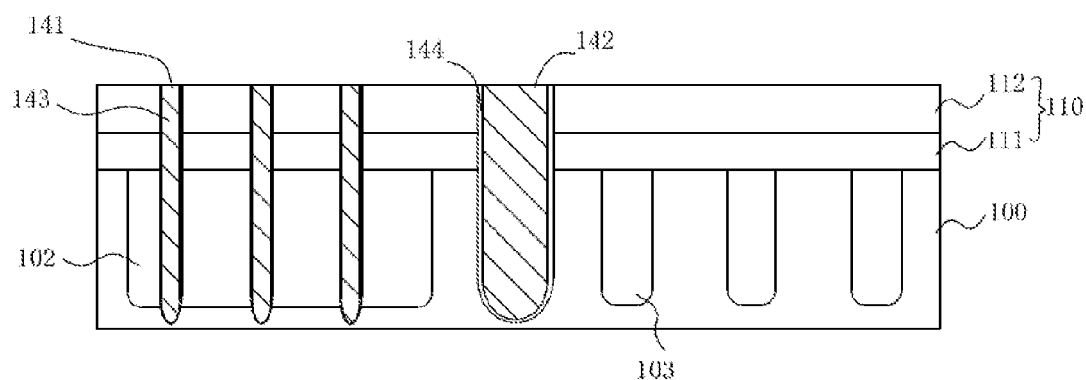
Figure 3D:
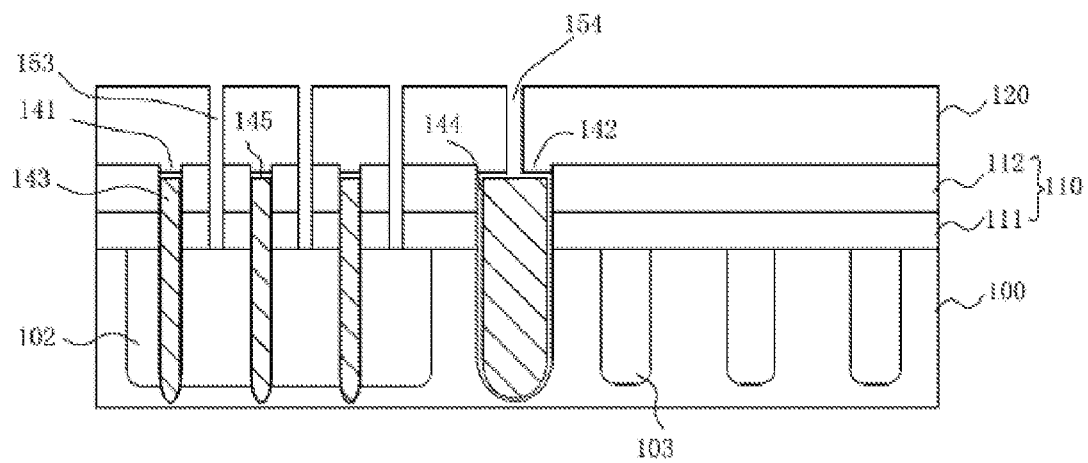
Figure 3E:
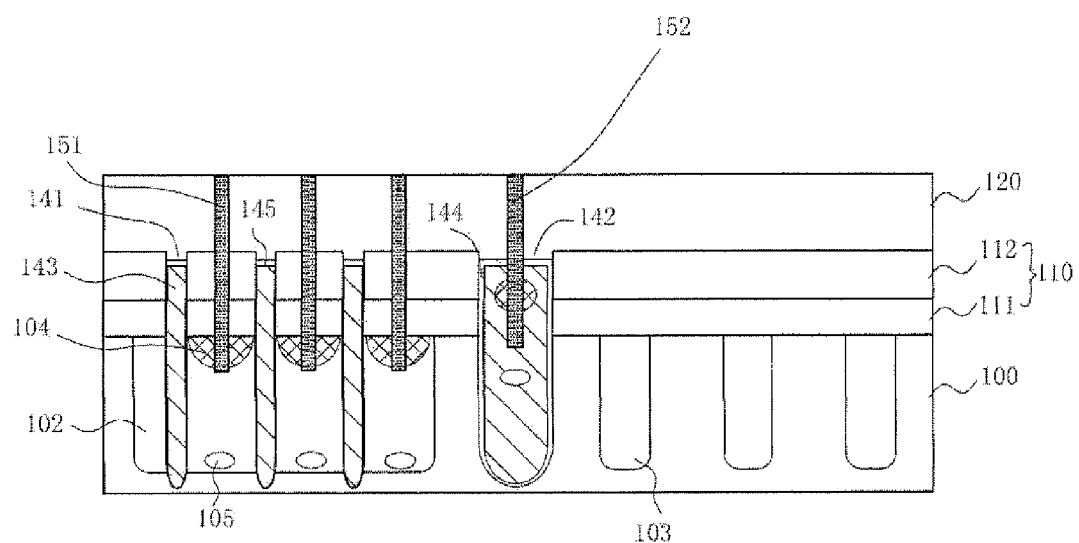

S3: gate oxide and gate polycrystalline silicon technology: an oxide layer 144 is formed on the trench wall of the trench, and the plurality of trenches are filled with conductive material 143. Generally, the conductive material 143 is polycrystalline silicon. In some especial application occasions, the conductive material 143 may be metals such as aluminum, copper and so on. The conductive material 143 and the oxide layer 144 constitutes the gate electrode of the device. Referring to FIG. 3C, it clearly shows that, in the embodiment, the overall gate electrode trenches protrude out of the substrate and reach the first dielectric layer 110. Compared to the traditional structure that producing the overall gate electrode trenches merely in the substrate, the gate electrode conductive material of the embodiment has a relative larger cross-sectional area, therefore, the gate electrode resistance thereof can be effectively reduced. The process specifically includes:

S31: a sacrificial oxide layer is manufactured on the substrate after step S25;

S32: the sacrificial oxide layer is fully stripped by wet-etching technology;

S33: gate-oxide technology: an oxide layer is manufactured within the trench, in general, the oxide layer is silicon dioxide.

S34: polycrystalline silicon is deposited on above-described structure by polycrystalline silicon deposition process, until the polycrystalline silicon covers the overall surface, causing the trench structure to be sufficiently filled with conductive material 143.

S35: a polycrystalline silicon/silicon dioxide high selectivity dry etching technology is preformed to remove all of the polycrystalline silicon exposed out of the trench structure, until the etching reaches the silicon dioxide material on the surface of the trench, thereby forming a structure having a cross-sectional view as shown in FIG. 3C.

S4: conductive via technology: a second dielectric layer 120 is deposited on the surface of the trenches and the first dielectric layer 110, and the second dielectric layer 120 is etched to form a first conductive via 153 and a second conductive via 154, the first conductive via 153 extends through the second dielectric layer 120, and the first dielectric layer 110, until the first conductive via 153 reaches the substrate 100. The second conductive via 154 extends through the second dielectric layer 120, until the second trench 142. The first conductive via 153 is located adjacent to the first trench 141, referring to FIG. 3D.

The process specifically includes:

S41: the polycrystalline silicon is oxidized, an oxide layer 145 is manufactured on a top of the conductive material 143 in the trench opening.

S42: a second dielectric layer is deposited, a second dielectric layer 120 is deposited on the surface of the trench and the first dielectric layer 110.

S43: windows for etching conductive via are manufactured on the second dielectric layer by photo-etching process. The detail of the photo-etching process can also refer to step S12.

S44: the windows formed by step S43 is employed as a mask, and a polycrystalline silicon/silicon dioxide high selectivity dry etching technology is applied to the second dielectric layer 120 and the first dielectric layer 110, to produce a conductive via. In the step, on the via adjacent to the second trench, when the above second dielectric layer 120 is etched, because the polycrystalline silicon is exposed on the bottom, the etching is approximately quitted at the bottom.

S45: redundant photo-resistant of step S43 is removed.

S5: source electrode region and conductive pole technology: a heavily doping of the first conductive type is applied to the active region 102 via the first conductive via 153, thereby forming the source electrode region 104. All of the conductive via is filled with tungsten, thereby forming the first conductive pole 151 and the second conductive pole 152, referring to FIG. 3E.

The process specifically includes:

S51: an N-type ion-implantation and a rapid thermal annealing are applied to the silicon substrate 100 via the first conductive via 153 to form an N--type heavily doped region, i.e. the source electrode region 104.

S52: the second dielectric layer 120 is employed as a mask, and an silicon etching is applied to the surface of the substrate 100 corresponding to the first conductive via 153, to extend the first conductive via 153 into the substrate 100, and extend the second conductive via 154 into the second trench, Further, an ion-implantation may be applied to the bottom of the active region 102 via the first conductive via 153, thereby forming a heavily doped P-type region 105. The heavily doped P-type region 105 is formed below the source electrode region 104, configured for improving a surging impact resistance of the device in switching transient.

S53: a titanium layer, or titanium oxide layer is deposited on the substrate after the step S52, serving as an conductive pole buffer layer.

S54: all of the conductive via are filled with tungsten to form conductive poles. Thereafter, a chemical-mechanical polishing is performed to remove the tungsten outside the holes.

S6: metallic layer technology: a metallic layer 130 is deposited on the second dielectric layer 120, and is etched to form a first electrode region 131 and a second electrode 132 insulated from each other. The first electrode region 131 is electrically connected to the source electrode region 104 via the first conductive pole 151, thereby forming the source electrode. The second electrode region 132 is electrically connected to the conductive material in the second trench via the second conductive pole 152, thereby forming the gate electrode. Hence, the trench-type DMOS device as shown in FIG. 1 is obtained.

The process specifically includes:

S61: a metal deposition is applied to the surface of the substrate after step S54, the metal may be Al, for example.

S62: windows for producing the first electrode region 131 and the second electrode 132 are formed on the surface of above-described metal, by photo-etching technology. Special details of the photo-etching process can be seen in step S12.

S63: the metal is etched via the windows formed by step S62 to form the first electrode region 131 and the second electrode 132, and then the redundant photo-resist is removed S64: finally, an alloying technology is performed.

It is should be noted that, the semiconductor technology adopted by the manufacturing method of the present invention, such as ion-implantation technology, or deposition technology of the layers, are conventional method at present. Therefore, specially illustration is not presented hereby. However, one skilled in the art can implement according to the method mentioned in the present invention, and as a conventional method, the technologies mentioned by the method above-described can be replaced by other technology having a same purpose but via different means.

With regard to the present invention, the advantages mainly depend upon:

First: the trenches which serves as the main gate electrode region extends from the surface of the first dielectric layer to the substrate, compared to the existing trenches manufactured merely in the substrate, the trench of the present invention enables the gate electrode polycrystalline silicon to have a relative larger cross-sectional area, and therefore, effectively reducing the gate electrode resistance Rg.

Second: in the process of manufacturing above-described device, the substrate is covered by the dielectric layer prior to etch the trenches, thus the original source electrode injection technology is thereby eliminated, instead, the source injection technology and the conductive via is conducted in one photo-etching step, reducing one step of photo-etching, thus simply the whole technology.

Although the present invention is illustrated and described herein with reference to specific embodiments, the present invention is not intended to be limited to the details shown. Rather, various modifications may be made in the details within the scope and range of equivalents of the claims and without departing from the present invention.

What is claimed is:

1. A trench-type DMOS device, comprising:
   a substrate of a first conductive type, the substrate serving as a common drain region;
   an active region of a second conductive type formed on the substrate;

a first dielectric layer formed on the substrate, the first dielectric layer defining a plurality of trenches extending from a surface of the first dielectric layer to an interior of the substrate, the plurality of trenches comprising a first trench located in the active region and a second trench located outside the active region, the first trench being fluid communicated with the second trench;

conductive material filled in the plurality of trenches;

an oxide layer positioned between the conductive material and trench walls of the plurality of trenches;

a source electrode region located in the active region and adjacent to the first trench;

a second dielectric layer covering the first dielectric layer and the plurality of trenches; and a metallic layer covering the second dielectric layer, wherein the metallic layer comprises a first electrode region and a second electrode region insulated from each other, the first electrode region is electrically connected to the source electrode region via a first conductive pole which extends through the first dielectric layer and the second dielectric layer, thereby forming a source electrode, the second electrode region is electrically connected to the conductive material via a second conductive pole which extends through the second dielectric layer, thereby forming a gate electrode.

2. The trench-type DMOS device according to claim 1, wherein a depth of the trench is greater than a depth of the active region.

3. The trench-type DMOS device according to claim 1, wherein the substrate is an N-type substrate, the active region is P-type active region, and the source electrode region is a heavily doped N-type region.

4. The trench-type DMOS device according to claim 3, further comprising a heavily doped P-type region located at a bottom of the active region beneath the source electrode region.

5. The trench-type DMOS device according to claim 1, wherein the conductive material is polycrystalline silicon, the oxide layer is made of silicon oxide.

6. The trench-type DMOS device according to claim 1, wherein the first conductive pole and the second conductive pole are made of tungsten.

7. The trench-type DMOS device according to claim 1, wherein the substrate further comprises a plurality of P-type voltage-dividing rings located around the active region.

8. The trench-type DMOS device according to claim 1, further comprising an oxide layer located on a top of the conductive material in the trench, wherein the oxide layer insolates the conductive material from the second dielectric layer.

9. The trench-type DMOS device according to claim 1, wherein the first dielectric layer comprises a boron phosphorous silicate glass layer, and a silicon oxide layer prepared from ethyl silicate, which is laminated on the boron phosphorous silicate glass layer.

10. A method of manufacturing a trench-type DMOS device, comprising:

providing a substrate of a first conductive type, the substrate serving as a common drain electrode region;

doping the substrate to form an active region of a second conductive type;

forming a first dielectric layer on the substrate, and etching the first dielectric layer to from a plurality of trenches, the plurality of trenches extending from a surface of the first dielectric layer to an interior of the substrate, the plurality of trenches comprising a first trench located in the active region and a second trench located outside the active region, the first trench being fluid communicated with the second trench;

forming an oxide layer on a trench wall of the trench, and filling the plurality of trenches with conductive material;

depositing a second dielectric layer on the first dielectric layer and surfaces of the trenches, and etching the second dielectric layer to form a first conductive via extending through the second dielectric layer and the first dielectric layer, until the first conductive via reaching the substrate, and forming a second conductive via extending through the second dielectric layer, until the second conductive via reaching the second trench, the first conductive via being adjacent to the first trench;

applying a heavily doping of the first conductive type to the active region via the first conductive via, thereby forming a source electrode region, and filling the first conductive via and the conductive via with tungsten, thereby forming a first conductive pole and a second conductive pole; and depositing a metallic layer on the second dielectric layer, and etching the metallic layer to form a first electrode region and a second electrode insulated from each other, electrically connecting the first electrode region to the source electrode region via the first conductive pole, thereby forming a source electrode, electrically connecting the second electrode region to the conductive material in the second trench via the second conductive pole, thereby forming a gate electrode.

11. The manufacturing method according to claim 10, wherein a depth of the trench is greater than a depth of the active region.

12. The manufacturing method according to claim 10, wherein the substrate is an N-type substrate, the active region is P-type active region, and the source electrode region is a heavily doped N-type region.

13. The manufacturing method according to claim 12, wherein prior to the filing the first conductive via with tungsten, the method further comprises: applying an ion-implantation to a bottom of the active region via the first conductive via to form a heavily doped P-type region, the heavily doped P-type region being located beneath the source electrode region.

14. The manufacturing method according to claim 10, wherein the conductive material is polycrystalline silicon, and the oxide layer is made of silicon oxide.

15. The manufacturing method according to claim 10, wherein after the forming an active region, the method further comprises: forming a plurality of P-type voltage-dividing rings around the active region of the substrate.

16. The manufacturing method according to claim 10, wherein after the filling the plurality of trenches with conductive material, the method further comprises: forming an oxide layer on a top of the conductive material in the trench, the oxide layer insolating the conductive material from the second dielectric layer.

* * * * *